United States Patent [19]

Asano et al.

[11] Patent Number: 4,723,082
[45] Date of Patent: Feb. 2, 1988

[54] SIGNAL TRANSFER CIRCUIT FOR USE IN LAMINATED MULTILAYER ELECTRIC CIRCUIT

[75] Inventors: Michio Asano, Tokorozawa; Akira Masaki, Musashino; Masaru Osani, Hachioji; Minoru Yamada, Iruma; Kenichi Ishibashi; Noboru Masuda, both of Kokubunji, all of Japan

[73] Assignee: Hitachi, Ltd., Tokyo, Japan

[21] Appl. No.: 884,896

[22] Filed: Jul. 14, 1986

[30] Foreign Application Priority Data

Jul. 19, 1985 [JP] Japan .................. 60-158198

[51] Int. Cl.$^4$ .................. H03K 19/017; H03K 19/094
[52] U.S. Cl. .................. 307/475; 307/303; 307/443; 307/451; 307/555; 361/393; 357/51; 357/75
[58] Field of Search ............ 307/303, 475, 443, 555, 307/560, 561, 451; 361/110, 111, 321, 393; 357/51, 68, 74, 75

[56] References Cited

U.S. PATENT DOCUMENTS

| | | | |
|---|---|---|---|
| 3,953,748 | 4/1976 | Sugiur et al. | 307/303 |
| 4,002,928 | 1/1977 | Goser et al. | 307/303 |
| 4,288,751 | 9/1981 | Yoshida et al. | 307/561 |
| 4,438,352 | 3/1984 | Mardkha | 307/475 |
| 4,508,981 | 4/1985 | Dorler et al. | 307/303 |
| 4,558,239 | 12/1985 | Kim et al. | 307/560 |

FOREIGN PATENT DOCUMENTS 56-2662  1/1981  Japan .

Primary Examiner—John S. Heyman
Attorney, Agent, or Firm—Antonelli, Terry & Wands

[57] ABSTRACT

A laminated multilayer electric circuit is comprised of wafers having each internal electric circuits and laminated one after another. A signal transfer circuit used in the laminated multilayer electric circuit for transfer of signals between the wafers through an electrostatic capacitor has a receiving circuit of sufficiently high input resistance for receiving a signal from a capacitance electrode forming the electrostatic capacitor, and a circuit for clamping the level of the signal substantially within the input amplitude for the receiving circuit. The signal transfer circuit permits the signal transfer to be performed not through a flip-flop or the like and consequently at high speeds.

19 Claims, 19 Drawing Figures

SIGNAL TRANSFER CIRCUIT FOR USE IN LAMINATED MULTILAYER ELECTRIC CIRCUIT

BACKGROUND OF THE INVENTION

This invention relates to a circuit for signal transfer between electric circuits formed on respective layers of a laminated multilayer electric circuit in which the electric circuits are packaged at high density and, more particularly, to a signal transfer circuit suitable for signal transfer between adjacent ones of a great number of wafers which are laminated for packaging.

A technique for high-density packaging of electric circuits has hitherto been known wherein a great number of wafers are laminated and a great number of electrodes are provided an on opposing surfaces of laminated wafers so as to be mutually contacted for signal transfer between wafers. This technique of signal transfer based on contacting of the electrodes faces results a problem that the more the number of electrodes increases, the larger than the part of the electrodes which is likely to end in a failure of contact, and is therefore unpractical. As an approach to this problem, a laminated multilayer electric circuit wherein electrodes between adjacent wafers are coupled for signal transfer through capacitance coupling has already been proposed in Japanese patent application Laid-Open No. 2662/81 Laid-Open on Jan. 12, 1981. In this circuit based on capacitance coupling, a change of a signal to be transferred through the capacitance coupling, that is, a signal having a waveform obtained by differentiating the signal is passed through the capacitor. Accordingly, by utilizing the resultant signal, a flip-flop is driven so that the signal to be transferred is reproduced and held in this flip-flop. Considering then the fact that the flip-flop is sensitive to noises, a pair of differential output signals are derived from a signal input signal and used to differentially drive one electrode of either of two pairs of capacitance electrodes, so that charge/discharge currents of the coupling capacitors can be passed without being circulated through power supply wirings between individual wafers, thereby preventing the flip-flop from operating erroneously owing to noises induced in the power supply wirings.

This laminated multilayer electric circuit using a flip-flop as described above suffers however from a delay in signal transfer at the flip-flop and is therefore unsatisfactory from the standpoint of operation speed. In addition, for prevention of erroneous operation of the flip-flop due to noises, the two pairs of capacitance electrodes are employed and driven differentially. Accordingly, this circuit arrangement requires the two pairs of capacitance electrodes in order to transfer a single signal and so it is unsuited for transferring of a large number of signals.

SUMMARY OF THE INVENTION

An object of this invention is to provide a signal transfer circuit, for effecting signal transfer between electric circuits of a laminated multilayer electric circuit through capacitance coupling, which does not require a flip-flop to reproduce the signal to be transferred and to hold the resultant signal therein, thereby ensuring that any signal delay at the flip-flop can be eliminated for high-speed signal transfer and provision of differential circuits, which are needed when the flip-flop is used, is not always required for prevention of erroneous operation.

Another object of this invention is to provide a signal transfer circuit for signal transfer between electric circuits of a laminated multilayer electric circuit through capacitance coupling which can permit transferring of a large number of signals by halving the number of capacitance electrodes as compared to the prior art circuit.

According to an aspect of the present invention, a signal transfer circuit is configured such that a receiving circuit connected to receive a signal from one capacitance electrode of a coupling capacitor has so high an input resistance that it can be considered practically infinite in order to hold the logical signal level itself of a signal applied to the other capacitance electrode, and a clamping circuit is connected to an input terminal of the receiving circuit so that the signal to the receiving circuit is changed within a range of a predetermined input level for the receiving circuit. The above arrangement can permit the receiving circuit to receive a change of a signal of a transmitting circuit as a change in DC level and can eliminate the provision of any flip-flop circuit for the receiving circuit. Essentially, a single pair of capacitance electrodes are enough for signal transfer.

DESCRIPTION OF THE PREFERRED EMBODIMENTS

Figure 1:
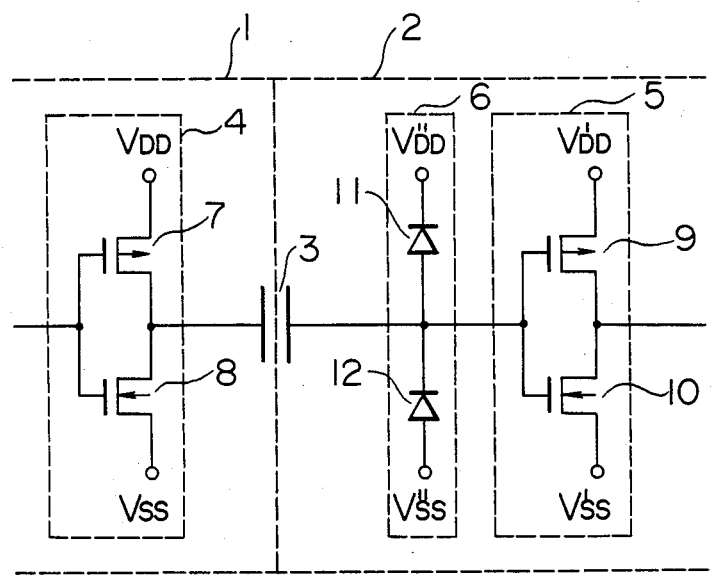
FIG. 1 is a circuit diagram of a laminated multilayer electric circuit according to an embodiment of the invention.

The invention will now be described by way of example with reference to the accompanying drawings. FIG. 1 shows a signal transfer circuit provided between a pair of electric circuit boards in accordance with an embodiment of the invention. Wafers 1 and 2 have opposing capacitance electrodes, respectively, to form a coupling capacitor 3. The wafer 1 has a transmitting circuit 4 for driving one of the capacitance electrodes, and the wafer 2 has a receiving circuit 5 for receiving a signal from the other of the capacitance electrodes and a clamping circuit 6 for clamping the signal level within a range of a predetermined input voltage for the receiving circuit

5. The transmitting circuit 4 comprises a PMOS transistor 7 and an NMOS transistor 8, these transistors having gate electrodes connected together to form a signal input terminal and drain electrodes connected together to supply a signal to the one capacitance electrode of the coupling capacitor 3. The PMOS transistor 7 has a source electrode connected to a power supply $V_{DD}$ and the NMOS transistor 8 has a source electrode connected to a power supply $V_{SS}$. Similarly, the receiving circuit 5 comprises a PMOS transistor 9 and an NMOS transistor 10, these transistors being mutually connected in a similar manner to the transistors of the transmitting circuit 4 so that the gate electrodes are connected together to receive the signal from the other capacitance electrode and the drain electrodes are connected together to produce an output signal. It is not always necessary that the power supplies $V_{DD}$ and $V_{SS}$ of the transmitting circuit 4 be identical to power supplies $V'_{DD}$ and $V'_{SS}$ of the receiving circuit 5. Irrespective of identity or non-identity, care must be taken not to induce noises between the power supplies $V_{DD}$ and $V'_{DD}$ and between the power supplies $V_{SS}$ and $V'_{SS}$. Power may be supplied to the individual wafers in various exemplary ways as will be described later with reference to FIGS. 3 to 6. The clamping circuit 6 comprises two diodes 11 and 12, with an anode electrode of the diode 11 and a cathode electrode of the diode 12 connected in common to the other capacitance electrode. A cathode electrode of the diode 11 is connected to a power supply $V''_{DD}$ and an anode electrode of the diode 12 to a power supply $V''_{SS}$. The power supply $V''_{DD}$ is set to a suitable potential which is equal to or lower than an upper limit input voltage for the receiving circuit 5, and the power supply $V''_{SS}$ is set to a suitable potential which is equal to or higher than a lower limit input voltage for the receiving circuit 5. More specifically, $V''_{DD}$ and $V''_{SS}$ are set such that somewhere between $V''_{DD}$ and $V''_{SS}$ is present the logic threshold value of an inverter forming the receiving circuit 5 and that $V''_{DD}$ and $V''_{SS}$ are within the range defined by an upper limit input voltage and a lower limit input voltage of the inverter, with $V''_{DD} - V''_{SS}$ set equal to or less than the input signal amplitude.

Figure 2:
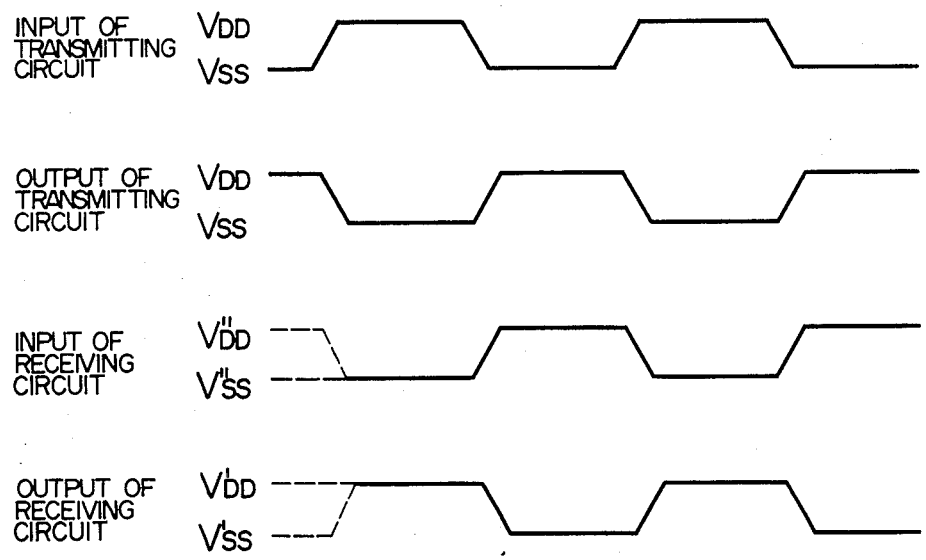
FIG. 2 is a timing chart useful in explaining the operation of the FIG. 1 embodiment.

The operation of the FIG. 1 circuit will now be described. FIG. 2 shows waveforms occurring in signal transfer by the FIG. 1 circuit. Assuming that the input of the transmitting circuit 4 is initially at a low level, the output of the transmitting circuit, acting as an inverter, is at a high level. The receiving circuit 5 is not DC coupled with the transmitting circuit and hence its input level is indefinite and so its output level is also indefinite. When the input of the transmitting circuit 4 changes from low level to high level and consequently the output thereof changes from high level to low level, the input of the receiving circuit 5 is forced to decrease from an initial level. However, as soon as the input of the receiving circuit 5 is forced to decrease below $V''_{SS}$, the diode 12 begins to conduct, with the result that the input of the receiving circuit 5 is eventually clamped to the predetermined low input level for the receiving circuit and the output thereof becomes high level. Because the diodes 11 and 12 of the clamping circuit are kept cut off until the output of the transmitting circuit is subsequently changed and because the gate electrodes of the MOS transistors 9 and 10 have a DC input resistance of $10^{13} \Omega$ or more, the input voltage of the receiving circuit 5 is kept substantially constant to hold the output thereof at high level. Consequently, when the input of the transmitting circuit 4 reaches the high level, the output level of the transmitting circuit 4 and the input level of the receiving circuit 5 coincide with the respective low levels. Once the coincidence of the output level with the input level is settled, a change of the signal level passed through the coupling capacitor 3 is then converted into a change of the input signal level about the threshold of the receiving circuit 5 and transmitted thereto.

Assuming that the input of the transmitting circuit 4 is initially high, the diode 11 operates, when the high level changes to the low level, to make the output of the transmitting circuit 4 and the input of the receiving circuit 5 coincident with the respective predetermined high levels and thereafter a change of the output signal level of the transmitting circuit 4 is transmitted to the receiving circuit 5 without fail. In the signal transfer circuit based on capacitance coupling in accordance with the present invention, the initial output signal logical level of the transmitting circuit does not always coincide with the initial input signal logical level of the receiving circuit but coincidence of these signal logical levels can be obtained when the output of the transmitting circuit changes for the first time. Thus, a pulse corresponding to this change may conveniently be produced from a reset signal generated when power supply to the circuit is turned on. Actually, in this embodiment, leakage currents flow through the input of the receiving circuit 5 and the clamping circuit 6 and therefore, maintaining of the input potential of the receiving circuit 5 can not be guaranteed over a time interval of the order of a second. Accordingly, this embodiment is typically used for signal transfer in which it is known that the signal duly changes at a short period. But especially where the signal remains unchanged over a long interval of time, this embodiment may be used by applying a reset signal prior to the subsequent transfer of a data signal in order to make the output logical level of the transmitting circuit 4 coincident with the input logical level of the receiving circuit 5.

Supply of power to the wafers 1 and 2 will now be described. As schematically shown in FIGS. 3 to 6, power may be supplied in various ways.

Figure 3:
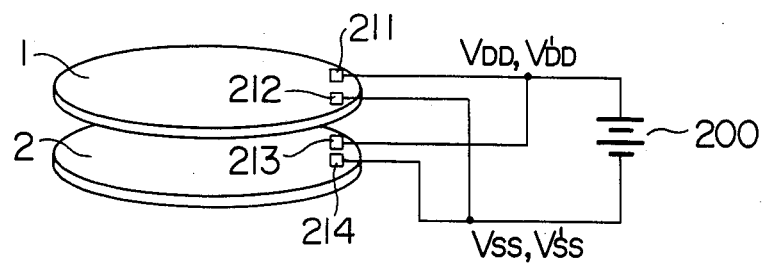
FIGS. 3 to 6 are diagrams showing various ways of power supplying applicable to respective embodiments shown in FIGS. 1, 7 to 10, 12 and 19.

In an example of FIG. 3, the wafers 1 and 2 are both supplied with power from a power source 200. In this case, $V_{DD}$ and $V'_{DD}$ are equal to one another and $V_{SS}$ and $V'_{SS}$ are equal to one another. Terminals 211 and 212 for power supplying are provided on the peripheral edge of the wafer 1, and $V_{DD}$ and $V_{SS}$ are supplied from the power source 200 to the wafer 1 through these terminals. Similarly, power supply terminals 213 and 214 are provided on the peripheral edge of the wafer 2, and $V'_{DD}$ and $V'_{SS}$ are supplied from the power source 200 to the wafer 2 through these terminals. In this example, it is necessary to provide in the wafer 2 a circuit for generating $V''_{DD}$ and $V''_{SS}$ from $V'_{DD}$ and $V'_{SS}$.

Figure 4:
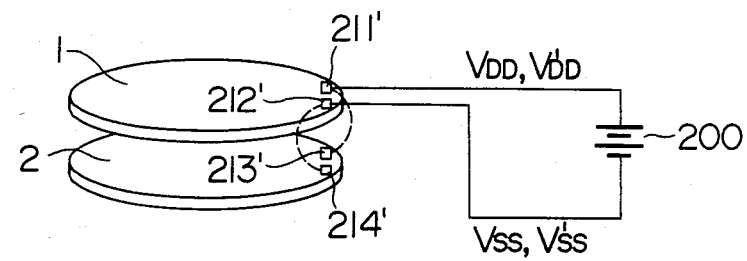

In an example of FIG. 4, both the wafers 1 and 2 are also supplied with power from the power source 200. In this example, power supply wiring for each wafer is not required. In particular, power supply terminals 211′ and 212′ for the wafer 1 extend through the wafer 1 and power supply terminals 213′ and 214′ for the wafer 2 also extend through the wafer 2. The terminals 211′ and 212′ are connected to the power source 200 by an external wiring. For supply of power to the wafer 2, the wafer 2 is brought into contact with the wafer 1 so that the terminals 211′ and 212′ of the wafer 2 respectively come into direct contact with the terminals 213′ and 214′ of the wafer 2. Because the number of terminals for direct contacting is very small in this example, there is no possibility that defective contact may occur.

Figure 5:
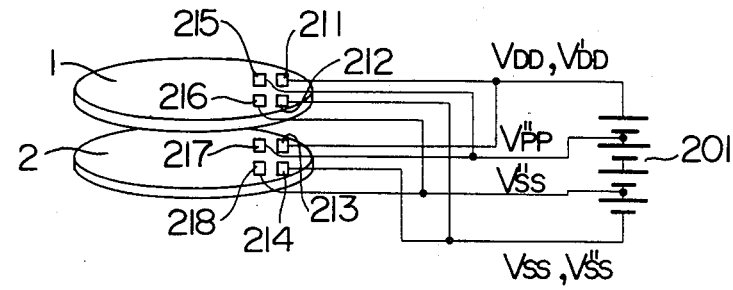

Basically, an example of FIG. 5 has the same circuit connection as that of the FIG. 3 example, but a power source 201 is connected to feed $V_{DD}$ (=$V'_{DD}$), $V_{SS}$ (=$V'_{SS}$), $V''_{DD}$ and $V''_{SS}$ and in addition to the terminals 213 and 214 for supply of $V'_{DD}$ and $V'_{SS}$, terminals 217 and 218 for supply of $V''_{DD}$ and $V''_{SS}$ are provided on the peripheral edge of the wafer 2. Signal transmission from the wafer 2 to the wafer 1 is also necessary in addition to the signal transmission from the wafer 1 to the wafer 2, and accordingly, the wafer 1 is provided with a receiving circuit. Thus, in the figure, terminals 215 and 216 and the associated wiring are shown for providing $V''_{DD}$ and $V''_{SS}$ to the clamping circuit in the receiving circuit.

Figure 6:
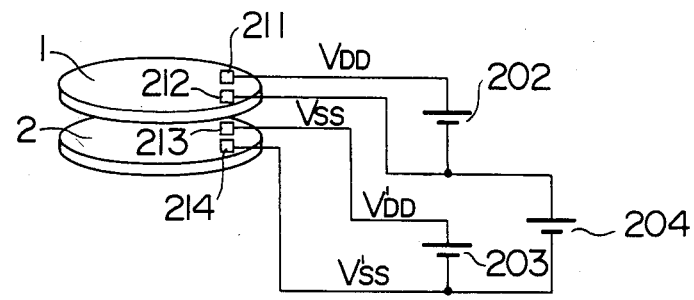

In an example of FIG. 6, the power supplies $V_{DD}$, $V_{SS}$ for the wafer 1 is not in common with the respective power supplies $V'_{DD}$, $V'_{SS}$ for the wafer 2 but are discrete therefrom. The wafer 1 is supplied with $V_{DD}$ and $V_{SS}$ from a power source 202 through power supply terminals 211 and 212, and the wafer 2 is supplied with $V'_{DD}$ and $V'_{SS}$ from a power source 203 through power supply terminals 213 and 214. A power source 204 is connected between $V_{SS}$ and $V'_{SS}$ and hence $V_{SS}$ is different from $V'_{SS}$ by an output voltage $V_S$ of the power source 204.

Figure 7:
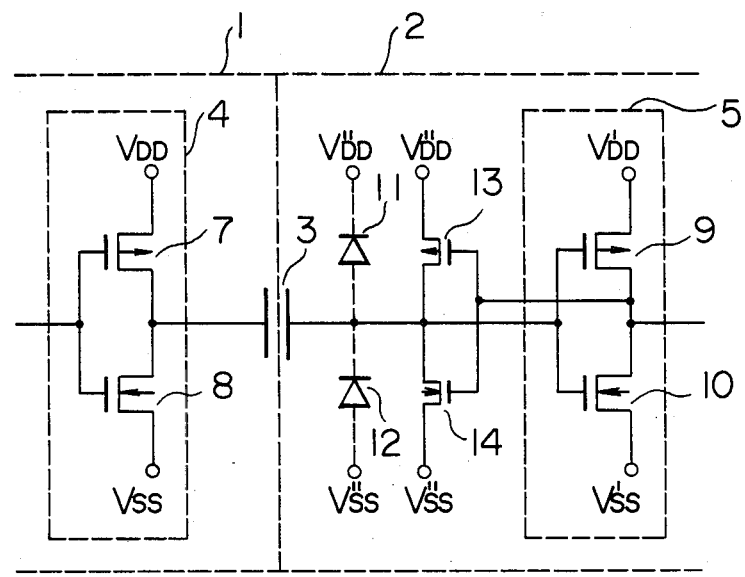
FIGS. 7 to 10 are circuit diagrams showing other embodiments of the invention, respectively.

FIG. 7 illustrates a signal transfer circuit according to a second embodiment of the invention wherein an additional circuit is provided which compensates the input voltage of the receiving circuit for a variation thereof caused by leakage currents in the FIG. 1 embodiment. When, in the circuit arrangement of the FIG. 1 embodiment, the level of input signal to the transmitting circuit 4 is kept constant over a long interval of time, for example, the low level keeps continuing, the level of input signal to the receiving circuit 5 (high level) gradually decreases because leakage current flows out of the gate electrode of, for example, NMOS transistor 10, resulting in a loss of charge of the coupling capacitor 3. The embodiment of FIG. 7 compensates for the leakage current and permits transfer of a signal containing a signal pattern whose level is unchangeable over a long interval of time.

In FIG. 7, elements like those of FIG. 1 are designated by like reference numerals and will not be described herein. The diodes 11 and 12 of clamping circuit 6 in FIG. 1 are respectively replaced with a PMOS transistor 13 and an NMOS transistor 14, and gate electrodes of these transistors are connected in common to the output terminal (drain electrodes of the PMOS transistor 9 and NMOS transistor 10) of the receiving circuit 5. Assuming now that the input level of the receiving circuit 5 is low, the output level thereof becomes high, rendering the NMOS transistor 14 conductive so as to hold the input of the receiving circuit 5 at the low level. When the input level of the receiving circuit 5 is high, the output level thereof becomes low, rendering the PMOS transistor 13 conductive so as to hold the input at the high level. The size of each of the PMOS transistor 13 and NMOS transistor 14 must be limited to a degree suitable for compensating for the leakage current. In other words, the ratio W/L must be sufficiently small, where W represents the gate width and L the gate length. It will be appreciated that the drain current $i_{DS}$ of the MOS transistor is proportional to W/L. Under the above limitation, when the output of the transmitting circuit 4 changes, for example, from low to high, the NMOS transistor 14 rendered conductive initially by the high level output of the receiving circuit 5 can eventually be allowed to pass only a small amount of current ($i_{DS}$) sufficient to compensate for the leakage current, thereby providing a raising effect of the input level of the receiving circuit. Subsequently, as soon as the output of the receiving circuit 5 has changed to low level, the NMOS transistor 14 is rendered off and the PMOS transistor 13 is rendered on with the result that the leakage current from the gate electrode of the NMOS transistor 10 can be compensated for, thereby maintaining the input of the receiving circuit 5 at the high level. The PMOS transistor 13 and NMOS transistor 14 also play the part of the clamping diodes 11 and 12. More particularly, when the input of the receiving circuit 5 is at a low level, this low level is not allowed to decrease below the power supply $V''_{SS}$ because of the NMOS transistor 14 rendered conductive and is eventually held at the level of $V''_{SS}$. However, as described previously, the ratio W/L between the gate width and gate length of the transistor is required to be small and the drain current $i_{DS}$ is limited. Accordingly, if the transistors 13 and 14 fail to provide a satisfactory clamping function on account of too small a drain current $i_{DS}$, clamping diodes 11 and 12 are additionally connected in parallel with the transistors 13 and 14, respectively, as shown at dotted line in FIG. 7. As will be clear from the above, this embodiment can compensate the input voltage of the receiving circuit for a variation thereof causes by a leakage current originating from a signal which is unchangeable over a long interval of time.

Figure 8:
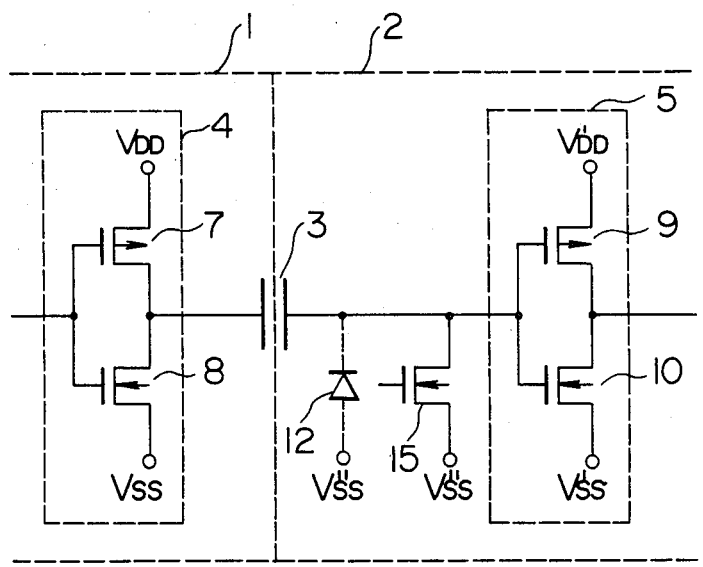

FIG. 8 illustrates a signal transfer circuit according to a third embodiment of the invention which is directed, like the FIG. 7 embodiment, to the prevention of erroneous operation of the receiving circuit due to leakage current. Depending on the type of a signal to be transferred, the transmitting/receiving circuit is not required to operate continuously and constantly but may be permitted to stop operating after transfer of data. In such an application, this embodiment is effective wherein the input potential of the receiving circuit is pre-charged to a predetermined level at a certain timing. An additionally provided NMOS transistor 15 has a drain electrode connected to the input of the receiving circuit 5, a source electrode connected to the power supply $V''_{SS}$, and a gate electrode which receives a pre-charge signal (high level) at a timing excluding a period for data transfer in order to change the input of the receiving circuit 5 to the low level by rendering the NMOS transistor conductive. Since the potential of the gate electrode is low or equal to the source potential and the NMOS transistor 15 remains cut off in the absence of the pre-charge signal, the input of the receiving circuit 5 changes from low to high when the output of the transmitting circuit 4 changes from low to high. On the other hand, when the output of the transmitting circuit 4 changes from high level to low level, the input of the receiving circuit 5 having a tendency toward decreasing to lower potential is maintained at the low level because the NMOS transistor 15 is turned on. In this manner, the NMOS transistor 15 also plays the part of the clamping diode 12 of the FIG. 1 embodiment. But if the changing function of the transistor 15 is insufficient, a diode 12 is connected in parallel with the source and drain electrodes of the NMOS transistor 15. The clamping diode 11 as employed in the previous embodiment is not required in the FIG. 8 embodiment.

The pre-charge signal is generated in a manner as exemplified below. Transfer of the data signal is so controlled as to be effected in synchronism with the clock signal used for operating logical circuits on the wafer. The data signal is supplied to the transmitting circuit by a signal instructing the data transfer synchronous with the clock signal and received by the receiving circuit, so that data is stored into a latch (flip-flop) in synchronism with the data transfer signal. Since in this arrangement the output of the receiving circuit is allowed to change in the absence of the data transfer signal, a circuit may be employed which is operated by the data transfer signal to generate a signal to be used as the pre-charge signal at a timing which does not overlap the data transfer signal. Especially where the pre-charge signal is so ruled as to be applied to the gate electrde of the NMOS transistor 15 prior to the transfer of the data signal, upon changing of the output of the transmitting circuit 4 from high level to low level, the input of the receiving circuit can be pre-charged so as to recover the level of the power supply $V''_{SS}$ prior to initiation of the data transfer, and so the clamping diode 12 becomes unnecessary. In this arrangement, the MOS transistors are of course required to have sufficiently high breakdown voltage.

Figure 9:
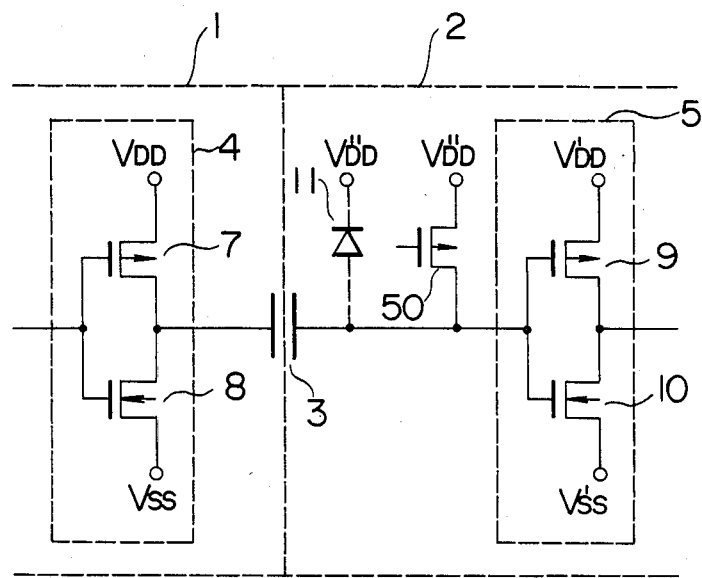

In place of the NMOS transistor 15 used in the FIG. 8 embodiment, a PMOS transistor 50 is used in a fourth embodiment of FIG. 9 for pre-charging the input of the receiving circuit 5 to the high level. As in the FIG. 8 embodiment, the PMOS transistor 50 also provides a clamping function. If the clamping function is insufficient, a diode 11, like the diode 12 in the FIG. 8 embodiment, may be connected in parallel with the source and drain electrodes of the PMOS transistor 50. The operation of the FIG. 9 embodiment is similar to that of the FIG. 8 embodiment and will not be detailed here.

In the present invention, a parasitic capacitor is formed on the input side of the receiving circuit, and the output amplitude of the transmitting circuit is divided by the coupling capacitor and the parasitic capacitor, giving rise to the input signal amplitude of the receiving circuit which is smaller than the output signal amplitude of the transmitting circuit. Accordingly, if the power supply voltages for the transmitting circuit and the receiving circuit are equal to each other, indicating $V_{DD} - V_{SS} = V'_{DD} - V'_{SS}$, in the embodiments of FIGS. 1, 7, 8 and 9, the input signal amplitude of the receiving circuit becomes smaller than the power supply voltage. Thus, the clamping range of the clamping circuit is set to fall within and to be narrower than the range of the power supply voltage, making $V''_{DD} \leq V'_{DD}$ and $V''_{SS} \geq V'_{SS}$, and the inverter of the receiving circuit is operated as an amplifier to change the output signal amplitude thereof within the range of $(V'_{DD} - V'_{SS})$. Therefore, a through current constantly flows, though small in amount, in the inverter of the receiving circuit. To prevent this, the power supply voltage for the transmitting circuit may be raised to increase the output signal amplitude of the transmitting circuit.

Figure 10:
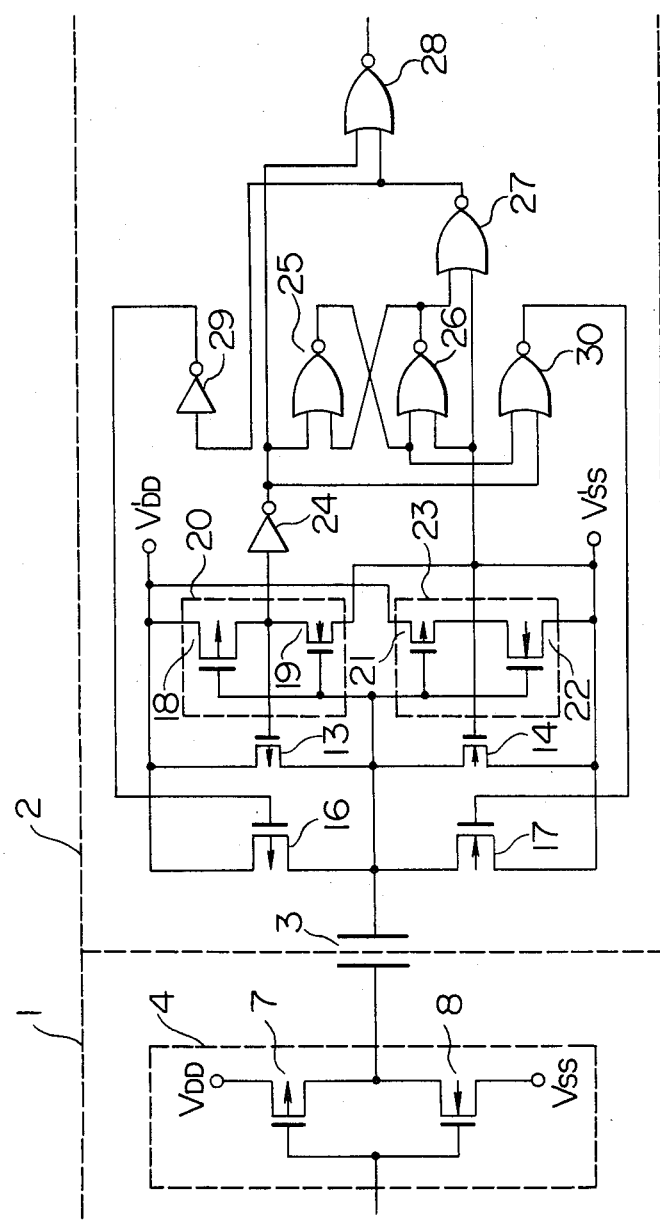

A circuit in accordance with a fifth embodiment of the invention as shown in FIG. 10 is directed to eliminating the flow of through current even when the input signal amplitude of the receiving circuit is smaller than the power supply voltage $(V'_{DD} - V'_{SS})$. The input voltage of the receiving circuit 4 is raised to the power supply voltage $V'_{DD}$ or $V'_{SS}$ by using a PMOS transistor 16 having a large gate width/gate length ratio W/L and an NMOS transistor 17 also having a large gate width/gate length ratio W/L. An input signal whose signal amplitude is represented as $V_{sig}$ is supplied to an inverter 20 which is comprised of a PMOS transistor 18 with a large gate width/gate length ratio W/L and an NMOS transistor 19 with a small gate width/gate length ratio W/L and which has a logical threshold voltage $V_{TH20}$ that is set around $V'_{DD} - V_{sig}/2$, and to an inverter 23 which is comprised of a PMOS transistor 21 with a small gate width/gate length ratio W/L and an NMOS transistor 22 and which has a logical threshold voltage $V_{TH23}$ that is set around $V'_{SS} + V_{sig}/2$. The above voltages $V'_{DD}$, $V'_{SS}$, $V_{sig}$, $V_{TH20}$ and $V_{TH23}$ are related to each other as diagrammatically illustrated in FIG. 11. Inverters 24 and 29 have a logical threshold voltage which is set around $(V'_{DD} + V'_{SS})/2$ and two-input NOR circuits 25, 26, 27, 28 and 30 are connected to the inverters 24 and 29 in a manner as illustrated in FIG. 10. The output of the NOR circuit 28 corresponds to the output of the receiving circuit. The elements 24 to 27, 29 and 30 constitute a circuit for controlling the gate electrodes of the MOS transistors 16 and 17.

Figure 11:
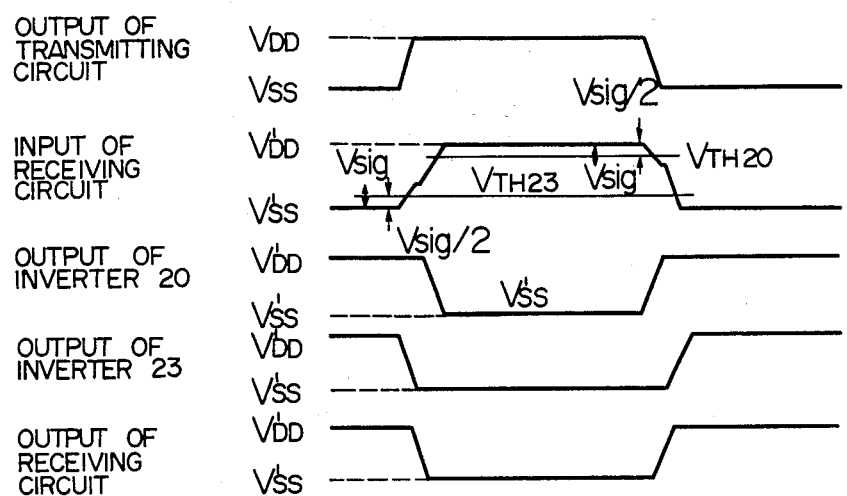
FIG. 11 is a timing chart useful in explaining the operation of the FIG. 10 embodiment.

Next, the operation will be explained with refernece to the timing chart of FIG. 11. Assuming that the input level of the receiving circuit is first $V'_{SS}$, then the outputs of the inverters 20 and 23 are both at high level, the output of the NOR circuit 25 is at high level, the output of the NOR circuit 26 is at low level, the output of the inverter 29 is at high level, the output of the NOR circuit 30 is at low level, and the output of the NOR circuit 28 is at high level. Consequently, the PMOS transistors 16 and 13 and the NMOS transistor 17 are rendered off and the NMOS transistor 14 is rendered on, thereby ensuring that leakage current can be compensated for to hold the input potential at $V'_{SS}$. Subsequently, as the output of the transmitting circuit 4 becomes high level and the input voltage of the receiving circuit increases by $V_{sig}$ from $V'_{SS}$, the output of the inverter 23 is inverted to low level. Then, the output of the NOR circuit 27 becomes high level, the output of the inverter 29 becomes low level, and the output of the NOR circuit 28 becomes low level, thereby inverting the output of the receiving circuit. At the same time, the NMOS transistor 14 is cut off and the PMOS transistor 16 is rendered conductive to increase the input voltage of the receiving circuit toward the power supply voltage $V'_{DD}$. Then, as the input voltage exceeds $V'_{DD} - V_{sig}/2$, the output of the inverter 20 also changes to low level to thereby render the output of the inverter 24 high, the output of the NOR circuit 25 low, the output of the NOR circuit 26 high, the output of the NOR circuit 27 low and the output of the inverter 29 high, leading to cut-off of the PMOS transistor 16 and conduction of the PMOS transistor 13. Thus, the input leakage current is compensated for by the PMOS transistor 13.

Conversely, when the output of the transmitting circuit 4 changes from high to low and the input voltage of the receiving circuit decreases by $V_{sig}$ from $V'_{DD}$, the output of the inverter 20 is first inverted to high, rendering the output of the inverter 24 low and the outputs of the NOR circuits 30 and 28 high. The output of the receiving circuit is thus inverted to high. At the same time, the PMOS tranisstor 13 is rendered off and the NMOS transistor 17 is rendered conductive to decrease the input voltage of the receiving circuit toward the power supply voltage $V'_{SS}$. As the input voltage falls below $V'_{SS} - V_{sig}/2$, the output of the inverter 23 also becomes high, rendering the output of the NOR circuit 25 high and the outputs of the NOR circuits 26 and 30 low, and hence the NMOS transistor 17 is rendered off and the NMOS transistor 14 is rendered on. Thus, the input leakage current is compensated for by the NMOS transistor 14.

The transistors 16 and 17 have the large ratio W/L for the sake of rapidly raising the input voltage of the receiving circuit to the power supply voltage $V'_{DD}$ or $V'_{SS}$ upon inversion of the output of the transmitting circuit, and the transistors 13 and 14 have the small ratio W/L suitable for compensating for the leakage current. In the above operation, while the former transistors are rendered off, the latter transistors are rendered on. Therefore, the FIG. 10 embodiment can permit the input voltage of the receiving circuit to change as in the FIG. 7 embodiment.

Figure 12:
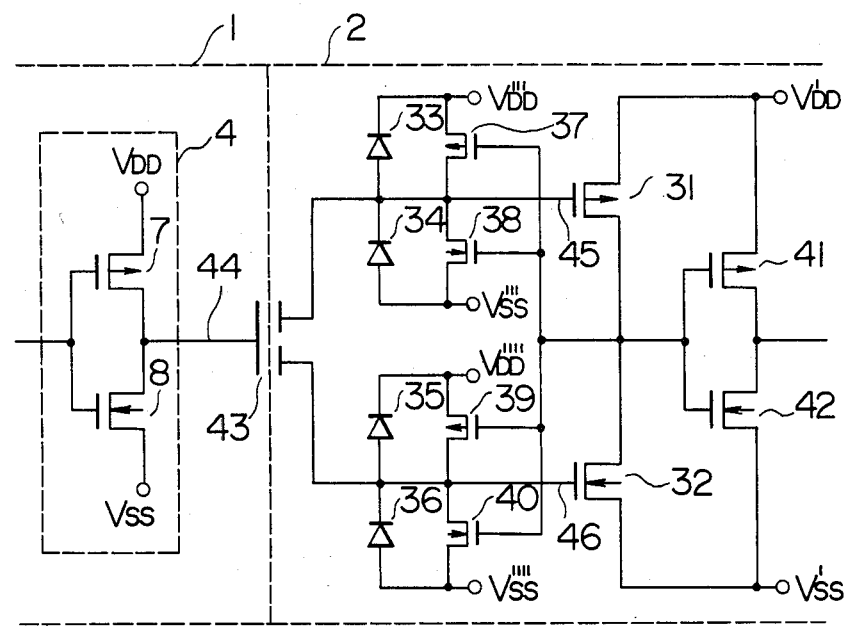
FIG. 12 is a circuit diagram showing a further embodiment of the invention.
Figure 13:
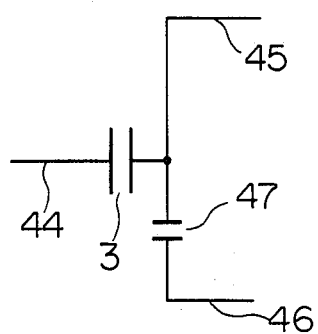
FIGS. 13 and 14 are circuit diagrams showing modified connections of a coupling capacitor shown in FIG. 12.
Figure 14:
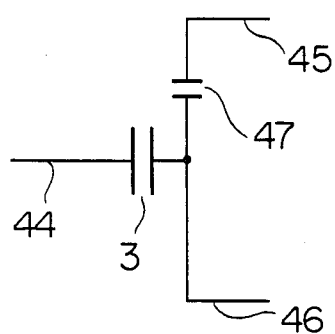

A sixth embodiment as shown in FIG. 12 is also directed, like the FIG. 10 embodiment, to eliminating the flow of through current even when the input signal amplitude of the receiving circuit is smaller than the power supply voltage ($V'_{DD}-V'_{SS}$). In this embodiment, a PMOS transistor 31 and an NMOS transistor 32, forming the first stage of the receiving circuit, have gate electrodes 45 and 46 which are not connected together but are separated for reception of respective voltages around threshold voltages of the PMOS transistor 31 and NMOS transistor 32 in order for these transistors 31 and 32 not to be rendered conductive simultaneously. To this end, the gate electrode 45 is connected, as illustrated, with clamping diodes 33 and 34, a PMOS transistor 37 for compensating for leakage current, and an NMOS transistor 38 so that the input voltage to the gate electrode 45 may fall within a range of from $V'_{DD}-|V_{THP}|$ to $V'_{DD}-|V_{THP}|-V_{sig}$, where $V_{THP}$ is the threshold voltage of the PMOS transistor 31 and $V_{sig}$ is the input signal amplitude. Similarly, the gate electrode 46 is connected as illustrated with clamping diodes 35 and 36, a PMOS transistor 39 for compensating for leakage current and an NMOS transistor 40 so that the input voltage may fall within a range of from $V'_{SS}+V_{THN}$ to $V'_{SS}+V_{THN}+V_{sig}$, where $V_{THN}$ represents the threshold voltage of the NMOS transistor 32. Power supply voltages $V'''_{DD}$, $V'''_{SS}$, $V''''_{DD}$ and $V''''_{SS}$ are so set as to aid the above clamping of signal levels applied to the gate electrodes 45, 46. An inverter comprised of a PMOS transistor 41 and an NMOS transistor 42 acts as a buffer circuit for driving a number of loads. A coupling capacitor 43 has one capacitance electrode connected to the output of the transmitting circuit as in the first to fifth embodiments and the other capacitance electrode which is connected to the input of the receiving circuit and which is divided into two sub-electrodes, one being connected to the gate electrode 45 and the other to the gate electrode 46. The connection of coupling capacitor 43 may be modified as illustrated in FIGS. 13 and 14. In a modification of FIG. 13, the same coupling capacitor 3 as that of the first to fifth embodiments is used with its capacitance electrode on the input side of the receiving circuit connected directly to the gate electrode 45 and also to the gate electrode 46 through a capacitor 47 formed on the wafer. In another modification of FIG. 14, the coupling capacitor 3 is connected directly to the gate electrode 46 and to the gate electrode 45 through the capacitor 47.

In operation, when the output signal, designated at 44, of the transmitting circuit is low, voltages at the gate electrodes 45 and 46 of the receiving circuit become $V'_{DD}-|V_{THP}|-V_{sig}$ and $V'_{SS}+V_{THN}$, respectively. to render the PMOS transistor 31 on and the NMOS transistor 32 off, thereby preventing the flow of through current. Similarly, when the output signal 44 of the transmitting circuit is at high level, voltages at the gate electrodes 45 and 46 of the receiving circuit become $V'_{DD}-|V_{THP}|$ and $V'_{SS}+V_{THN}+V_{sig}$, respectively, rendering the PMOS transistor 31 off and the NMOS transistor 32 on to prevent the flow of through current.

It will be appreciated that if the MOS transistors 37 to 40 have sufficient clamping function, then the clamping diodes 33 to 36 may be eliminated as in the FIG. 7 embodiment.

Figure 15:
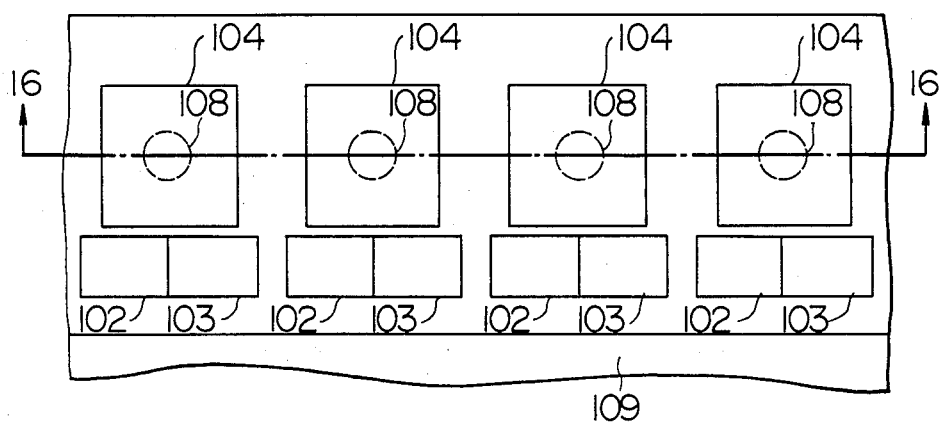
FIG. 15 is a plan view of a wafer carrying a number of signal transfer circuits according to the invention.
Figure 16:
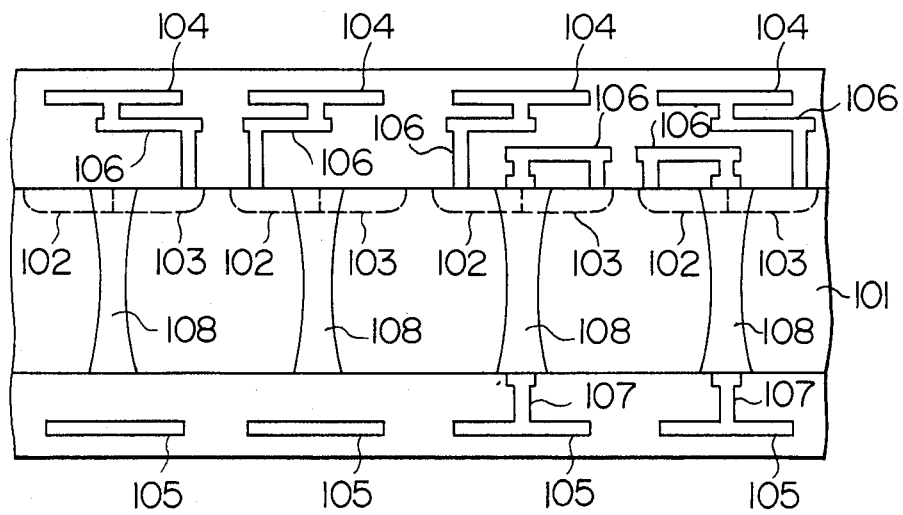
FIG. 16 is a sectional view taken on the line 16—16 of FIG. 15.
Figure 17:
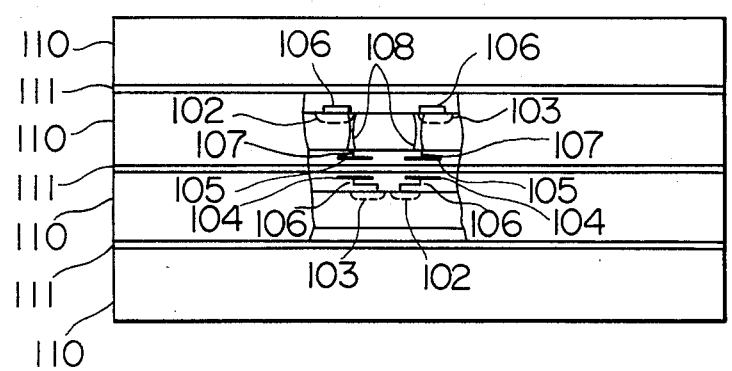
FIGS. 17 and 18 are diagrams showing examples of laminated wafers each carrying capacitance coupling circuits.

FIG. 15 shows, in plan view, a wafer carrying signal transfer circuits in accordance with the first to sixth embodiments and FIG. 16 is a sectional view taken on the line 16—16 of FIG. 15. A laminated electric circuit to which the present invention is applicable is constructed by laminating wafers shown in FIGS. 15 and 16. The wafer includes a semiconductor substrate 101 having an upper surface in which a great number of sets of transmitting circuit 102 and receiving circuit 103 are formed and to which is contiguous a layer containing capacitance electrodes 104 and wirings 106, and a lower surface contiguous to a layer containing capacitance electrodes 105 and wirings 107. The upper components are connected, as necessary, with the lower components by electrically conductive regions 108 extending through the substrate 101. The sets of transmitting circuit 102 and receiving circuits 103 are arranged near the contour of a logical circuit section 109. Alternatively, the sets of transmitting circuit 102 and receiving circuit 103 and the capacitance electrodes 104 may be distributed in the logical circuit section 109. The electrically conductive regions 108 may be formed using a known selective diffusion technique disclosed in Japanese patent application Laid-open No. 2662/81, a technique of thermo-migration described in IEEE, Trans. Computer, Vol. C-33, No. 1, Jan. 1984, pp. 69–81, or a technique of boring through holes in a wafer substrate disclosed in Japanese patent application Laid-open No. 222954/84. A plurality of wafers each carrying signal transfer circuits shown in FIGS. 15 and 16 are laminated as exemplified in FIG. 17 in which reference numeral 110 denotes the wafers and 111 insulating sheets of high dielectric constant. An illustration of FIG. 17 is partly sectioned to show signal transfer between the wafers. For signal transfer from an upper wafer to a lower wafer, an output signal from a transmitting circuit 102 on the upper wafer is led through wiring 106, electrically conductive region 108 and wiring 107 to a capacitance electrode 105 and then a signal from a capacitance electrode 104 on the lower wafer forming together with the capacitance electrode 105 a coupling capacitor is supplied through a wiring 106 to a receiving circuit 103. Similarly, for signal transfer from a lower wafer to an upper wafer, an output signal from a transmitting circuit 102 on the lower wafer is led through a wiring 106 to a capacitance electrode 104 and then a signal from a capacitance electrode 105 on the upper wafer forming together with the capacitance electrode 104 a cpuling capacitor is supplied through wiring 107, electrically conductive region 108 and wiring 106 to a receiving circuit 103. For the purpose of signal transfer between only two wafers, both the wafers can be dispensed with the electrically conductive regions 108 extendihng through the semiconductor substrate 101 and the wirings 107 and capacitance electrodes 105 contained in the layer contiguous to the lower surface of the semiconductor substrate 101, because a capacitance electrode 104 of one wafer contained in the layer contiguous to the upper surface of the semiconductor substrate 101 formed with transmitting and receiving circuits 102 and 103 can oppose a capacitance electrode 104 of the other wafer to form a coupling capacitor by placing the latter wafer upside down.

Figure 18:
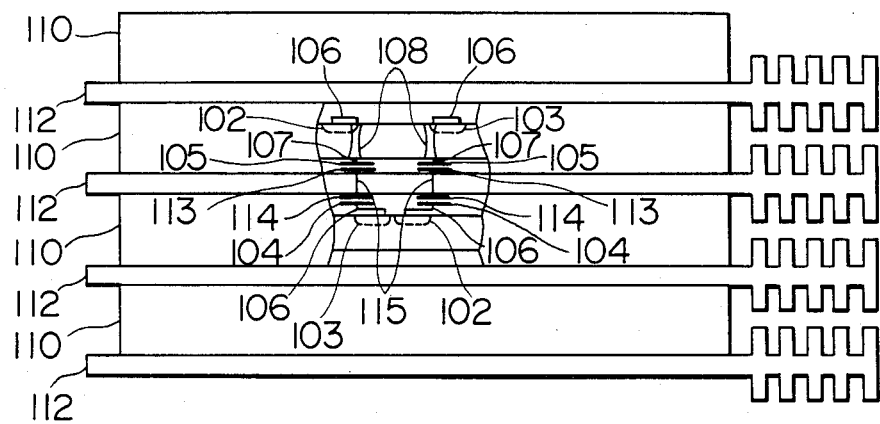

Wafers of large power consumption requiring cooling are laminated as exemplified in FIG. 18. A connecting board 112 also serves as heat sink for cooling the wafer and has an upper surface provided with capacitance electrodes 113 which form, together with capacitance electrodes 105, coupling capacitors and a lower surface provided with capacitance electrodes 114 which form, together with capacitance electrodes 104, coupling capacitors. The upper capacitance electrodes 113 are connected to the lower capacitance electrodes 114 by conductors 115. Thus, in this example, the coupling capacitor defined by the capacitance electrodes 105 and 113 is connected in series with the coupling capacitor defined by the capacitance electrodes 104 and 114 to provide an ultimate resultant coupling capacitor.

Figure 19:
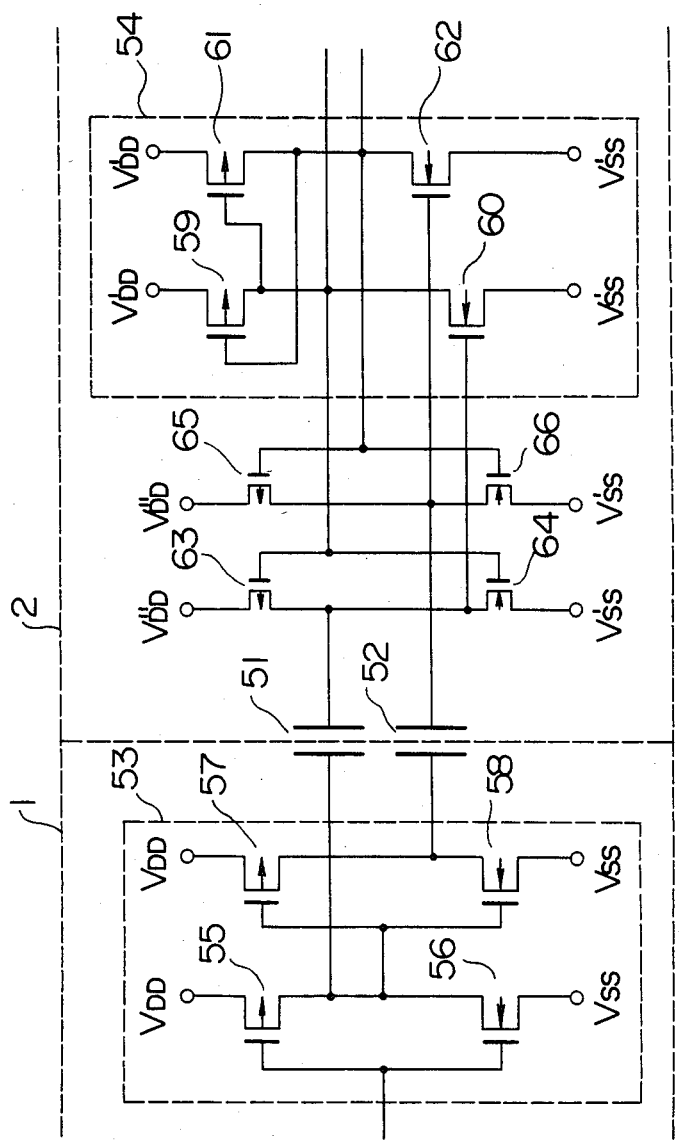
FIG. 19 is a circuit diagram of a still further embodiment of the invention.

FIG. 19 shows a signal transfer circuit according to a seventh embodiment of the invention. In this embodiment, two coupling capacitors 51 and 52 are used to transfer a differential output. A differential transmitting circuit 53 comprises PMOS transistors 55 and 57 and NMOS transistors 56 and 58. These transistors are connected to form two stages of cascaded inverters (each inverters corresponding to the transmitting circuit 4 in the previous embodiments). The output of each inverter is connected to one electrode of either of two pairs of capacitance electrodes. A differential receiving circuit 54 comprises PMOS transistors 59 and 61 and NMOS transistors 60 and 62. The NMOS transistors 60 and 62 have gate electrodes connected to receive differential signals originating from the other electrode of each of the two pairs of capacitance electrodes, source electrodes both connected to the power supply $V'_{SS}$ and drain electrodes respectively connected to drain electrodes of the PMOS transistors 59 and 61 to form an output terminal and an inverting output terminal, respectively. The PMOS transistors 59 and 61 have gate electrodes respectively connected to the inverting output terminal and the output terminal, and source electrodes both connected to the power supply $V'_{DD}$. PMOS transistors 63 and 65 and NMOS transistors 64 and 66 are adapted, like the transistors 13 and 14 in the FIG. 7 embodiment, to hold two input voltages to the differential receiving circuit 54 and calmp the input signal levels, and they are connected to form two stages of clamping circuits each corresponding to the clamping circuit of FIG. 7. Source electrodes of the PMOS transistors 63 and 65 are however connected to the power supply $V''_{DD}$ which is lower than not only $V_{DD}$ but also $V'_{DD}$, so that the input signal level may be clamped at a lower voltage than the power supply $V'_{DD}$. In this embodiment, opposite phase signals are transferred through two coupling capacitors but basically, the operation of this embodiment is the same as that of the FIG. 7 embodiment. The transmitting/receiving circuit in this embodiment operates differentially and the signal amplitude is considered to be substantially doubled as compared to the FIG. 7 embodiment. This leads to an advantage that even when the output signal amplitude of the transmitting circuit is divided by the coupling capacitor and the parasitic capacitor formed on the input side of the receiving circuit to thereby decrease the input signal amplitude of the receiving circuit, a large operating margin can be obtained. In fact, by applying differential driving to the FIG. 7 embodiment, there results this embodiment of FIG. 19. Obviously, the differential driving may also be applied to the other embodiments.

As described above, according to the invention, signal transfer between laminated electric circuits is effected through the coupling capacitor and therefore a failure of contacting between electrodes, encountered in the conventional circuit, will not occur. In addition, by approximating the input resistance of the receiving circuit to infinity, the transmitting waveform can be received directly through the coupling capacitor without resort to a circuit of relatively large delay time such as a flip-flop and so the speed of signal transfer can be improved. Moreover, since the signal transfer is not always required to be of differential type, the number of capacitance electrodes can be halved to enhance capacity of multiple pin coupling.

While this invention has been described with reference to illustrative embodiments, this description is not intended to be construed in a limiting sense. Various modifications to the illustrative embodiments, as well as other embodiments of the invention, will be apparent to persons skilled in the art upon reference to this description. It is therefore contemplated that the appended claims will cover any such modifications or embodiments as fall within the true scope of the invention.

We claim:

1. A signal transfer circuit whichis used in a laminated multilayer electric circuit comprised of a plurality of board-like electric circuit packaging means each having at least one internal electric circuit and being laminated one after another, for transferring signals between electric circuits provided in two adjacent electric circuit packaging means, said signal transfer circuit comprising:

at least one first electrode disposed near the surface of a first one of said two adjacent electric circuit packaging means;

at least one second electrode disposed near the surface of a second one of said two adjacent electric circuit packaging means to oppose said first electrode, said first and second electrodes forming a first coupling capacitor;

transmitting circuit means disposed within said first packaging means and having an output connected to said first electrode and an input connected to receive an output signal from the electric circuit provided in said first packaging means, so as to drive said first electrode in accordance with the output signal of said electric circuit; and receiving circuit means disposed within said second packaging means and having aninput connected to said second electrode and an output connected to an input of the electric circuit provided in said second packaging means, so as to generate an output signal in accordance with an input signal induced in said second electrode, said receiving circuit means having a high input impedance MOS inverter directly connected to said second electrode and including clamping means for limiting the level of said input signal induced in said second electrode within a predetermined input amplitude for said receiving circuit means.

2. A signal transfer circuit according to claim 1, wherein said clamping means comprises a PMOS transistor having a source electrode connected to a voltage corresponding to a predetermined high level of the input signal to said receiving circuit means, a drain electrode connected to the input of said receiving circuit means, and a gate electrode connected to the output of said receiving circuit means, and an NMOS transistor having a source electrode connected to a voltage corresponding to a predetermined low level of the input signal to said receiving circuit means, a drain electrode connected to the input of said receiving circuit means, and a gate electrode connected to the output of said receiving circuit means, whereby leakage current through the input of said receiving circuit means is compensated for.

3. A signal transfer circuit according to claim 1, wherein said receiving circuit means comprises a CMOS inverter.

4. A signal transfer circuit according to claim 2, wherein said second electrode includes means for forming a second coupling capacitor electrically connected to said first coupling capacitor, said receiving circuit means comprising means including a PMOS transistor and an NMOS transistor having source electrodes respectively connected to each output terminal of a power source for said receiving circuit means, drain electrodes connected in common to constitute the output of said receiving circuit means, and gate electrodes respectively connected to each of said first and second coupling capacitors, and means for setting levels of input signals induced in said first and second coupling capacitors around threshold voltages of said PMOS transistor and said NMOS transistor.

5. A signal transfer circuit according to claim 2, further comprising a third electrode disposed near the surface of said first packaging means and a fourth electrode disposed near the surface of said second packaging means to oppose said third electrode, said third and fourth electrodes forming a second coupling capacitor, wherein said transmitting circuit means includes differential transmitting circuit means having outputs respectively connected to said first and third electrodes and being responsive to an output signal from said electric circuit provided in said first packaging means to differentially drive said first and third electrodes, wherein said receiving circuit means includes differential receiving circuit means having inputs respectively connected to said second and fourth electrodes and being responsive to differential input signals induced in said second and fourth electrodes to generate output signals, and wherein said clamping means includes differential signal clamping means for limiting respective levels of said differential input signals within respective predetermined input amplitudes for said differential receiving circuit means.

6. A signal transfer circuit according to claim 1, wherein said clamping means comprises a PMOS transistor having a source electrode connected to a voltage corresponding to a predetermined high level of the input signal to said receiving circuit means and a drain electrode connected to the input of said receiving circuit means, said PMOS transistor being rendered conductive prior to the signal transfer so as to set the input voltage of said receiving circuit means to said predetermined high level.

7. A signal transfer circuit according to claim 6, wherein said receiving circuit means comprises a CMOS inverter.

8. A signal transfer circuit according to claim 1, wherein said clamping means comprises an NMOS transistor having a source electrode connected to a voltage corresponding to a predetermined low level of the input signal to said receiving circuit means and a drain electrode connected to the input of said receiving circuit means, said NMOS transistor being rendered conductive prior to the signal transfer so as to set input voltage of said receiving circuit means to said predetermined low level.

9. A signal transfer circuit according to claim 8, wherein said receiving circuit means comprises a CMOS inverter.

10. A signal transfer circuit according to claim 1, wherein said receiving circuit means comprises a CMOS inverter.

11. A signal transfer circuit according to claim 1, wherein said second electrode includes means for forming a second coupling capacitor electrically connected to said first coupling capacitor, said receiving circuit means comprising means including a PMOS transistor and an NMOS transistor having source electrodes respectively connected to each output terminal of a power source for said receiving circuit means, drain electrodes connected in common to constitute the output of said receiving circuit means, and gate electrodes respectively connected to each of said first and second coupling capacitors, and means for setting levels of input signals induced in said first and second coupling capacitors around threshold voltages of said PMOS transistor and said NMOS transistor.

12. A signal transfer circuit according to claim 11, said second coupling capacitor forming means includes said second electrode divided into two sub-electrodes, one of said two sub-electrodes being coupled with a part of said first electrode to form said first coupling capacitor and the other one of said two sub-electrodes being coupled with a part of said first electrode to form said second coupling capacitor.

13. A signal transfer circuit according to claim 11, said second coupling capacitor forming means includes a capacitor formed on said second electric circuit packaging means electrically connected to said second electrode.

14. A signal transfer circuit according to claim 1, further comprising a third electrode disposed near the surface of said first packaging means and a fourth electrode disposed near the surface of said second packaging means to oppose said third electrode, said third and fourth electrodes forming a second coupling capacitor, wherein said transmitting circuit means includes differential transmitting circuit means having outputs respectively connected to said first and third electrodes and being responsive to an output signal from said electric circuit provided in said first packaging means to differentially drive said first and third electrodes, wherein said receiving circuit means includes differential receiving circuit means having inputs repectively connected to said second and fourth electrodes and being responsive to differential input signals induced in said second and fourth electrodes to generate output signals, and wherein said clamping means includes differential signal clamping means for limiting respective levels of said differential input signals within respective predetermined input amplitudes for said differential receiving circuit means.

15. A signal transfer circuit which is used in a laminated multilayer electric circuit comprised of a plurality of board-like electric circuit packaging means having each at least one internal electric circuit and laminated one after another for transferring signals between electric circuits provided in two adjacent electric circuit packaging means, said signal transfer circuit comprising:

at least one first electrode disposed near the surface of a first one of said two adjacent electric circuit packaging means;

a second electrode disposed near the surface of a second one of said two adjacent electric circuit packaging means to oppose said first electrode, said first and second electrodes forming a first coupling capacitor;

transmitting circuit means disposed within said first packaging means and having an output connected to said first electrode and an input connected to receive an output signal from the electric circuit provided in said first packaging means, so as to drive said first electrode in accordance with the output signal of said electric circuit; and receiving circuit means disposed within said second packaging means and having an input connected to said second electrode and an output connected to an input of said the electric circuit provided in said second packaging means, so as to generate an output signal in accordance with an input signal induced in said second electrode, said receiving circuit means including voltage raising/lowering means having a high input impedance MOS inverter directly connected to said second electrode and being operable under the application of predetermined first and second power supply voltages to raise the input voltage level of said receiving circuit means to said first power supply voltage when the input signal induced in said second electrode is at a high level the input voltage level of said receiving circuit means to said second power supply voltage when said induced input signal is at a low level.

16. A signal transfer circuit according to claim 15, wherein said receiving circuit means further comprises:

a first inverter having a high input impedance and a threshold which is lower than a potential developing at said second electrode when the input signal induced in said second electrode is at the high level;

a second inverter having a high input impedance and a threshold which is higher than a potential developing at said second electrode when the input signal induced in said second electrode is at the low level;

means responsive to output signals of said first and second inverters to control said voltage raising/lowering means such that when said input signal induced in said second electrode is at the high level, the input of said receiving circuit means is raised to said first power supply voltage and when said input signal induced in said second electrode is at the low level, the input of said receiving circuit means is lowered to said second power supply voltage; and means, connected between the input of said first and second inverters and either of said first and second power supply voltages, for compensating for leakage current through the inputs of said first and second inverters.

17. A laminated multilayer electric circuit comprising:

a plurality of board-like electric circuit packaging means having each at least one internal electric circuit and laminated one after another;

at least one first electrode disposed near the surface of a first one of two adjacent electric circuit packaging means;

a second electrode disposed near the surface of a second one of said two adjacent electric circuit packaging means to oppose said first electrode, said first and second electrodes forming a first coupling capacitor;

transmitting circuit means disposed within said first packaging means and having an output connected to said first electrode and an input connected to receive an output signal from the electric circuit provided in said first packaging means, so as to drive said first electrode in accordance with the output signal of said electric circuit; and receiving circuit means disposed within said second packaging means and having an input connected to said second electrode and an output connected to an input of the electric circuit provided in said second packaging means, so as to generate an output signal in accordance with an input signal induced in said second electrode, said receiving circuit means having a high input impedance MOS inverter directly connected to said second electrode and including clamping means for limiting the level of said input signal induced in said second electrode within a predetermined input amplitude for said receiving circuit means.

18. A laminated multilayer electric circuit according to claim 17 further comprising an insulating sheet of high dielectric constant interposed between said first and second packaging means.

19. A laminated multilayer electric circuit according to claim 17 further comprising a board interposed between said first and second packaging means to act as heat sink, said board having, on one surface close to said first packaging means, a third electrode opposing said first electrode and, on the other surface close to said second packaging means, a fourth electrode opposing said second electrode, said third and fourth electrodes being electrically connected together through said board.

* * * * *